United States Patent
Hashmi

(10) Patent No.: US 12,519,072 B2
(45) Date of Patent: Jan. 6, 2026

(54) SOLDER BUMP CONFIGURATIONS IN CIRCUITRY AND METHODS OF MANUFACTURE THEREOF

(71) Applicant: SONOVA AG, Staefa (CH)

(72) Inventor: Anwar Hashmi, Staefa (CH)

(73) Assignee: Sonova AG, Staefa (CH)

( * ) Notice: Subject to any disclaimer, the term of this patent is extended or adjusted under 35 U.S.C. 154(b) by 366 days.

(21) Appl. No.: 18/070,109

(22) Filed: Nov. 28, 2022

(65) Prior Publication Data
US 2024/0178174 A1 May 30, 2024

(51) Int. Cl.
*H01L 23/00* (2006.01)
*H04R 25/00* (2006.01)

(52) U.S. Cl.
CPC .............. *H01L 24/14* (2013.01); *H01L 24/16* (2013.01); *H01L 24/81* (2013.01); *H04R 25/609* (2019.05); *H01L 24/13* (2013.01); *H01L 2224/13111* (2013.01); *H01L 2224/13139* (2013.01); *H01L 2224/13147* (2013.01); *H01L 2224/14177* (2013.01); *H01L 2224/14517* (2013.01); *H01L 2224/16225* (2013.01); *H01L 2224/81801* (2013.01); *H01L 2924/014* (2013.01)

(58) Field of Classification Search
CPC .............................. H04R 25/609; H01L 24/14
See application file for complete search history.

(56) References Cited

U.S. PATENT DOCUMENTS

| | | | |
|---|---|---|---|
| 2007/0069378 A1* | 3/2007 | Park | H05K 3/303 257/737 |
| 2009/0212423 A1* | 8/2009 | Tanaka | H01L 23/49811 257/737 |
| 2010/0158296 A1* | 6/2010 | Dumas | H04R 25/00 381/328 |
| 2014/0029216 A1 | 1/2014 | Ukita | |
| 2023/0232170 A1* | 7/2023 | Casper | H04R 25/65 381/317 |

* cited by examiner

*Primary Examiner* — Sunita Joshi
(74) *Attorney, Agent, or Firm* — ALG Intellectual Property, LLC

(57) ABSTRACT

An exemplary hearing device includes a housing and a chip package disposed within the housing. The chip package may comprise a printed circuit board, an integrated circuit configured to perform an electronic function associated with the hearing device, and a plurality of solder bumps on a bottom surface of the integrated circuit. The plurality of solder bumps may provide conductive connectivity between the integrated circuit and the printed circuit board. The plurality of solder bumps may comprise a first group of solder bumps located within a center region of the bottom surface of the integrated circuit and a second group of solder bumps located within a peripheral region of the bottom surface, the peripheral region surrounding the center region. All signals required for the integrated circuit to perform the electronic function may be provided by way of the first group of solder bumps.

16 Claims, 6 Drawing Sheets

SOLDER BUMP CONFIGURATIONS IN CIRCUITRY AND METHODS OF MANUFACTURE THEREOF

BACKGROUND INFORMATION

Hearing devices (e.g., hearing aids) are used to improve the hearing capability and/or communication capability of users of the hearing devices. Such hearing devices are configured to process a received input sound signal (e.g., ambient sound) and provide the processed input sound signal to the user (e.g., by way of a receiver (e.g., a speaker) placed in the user's ear canal or at any other suitable location).

As hearing device technology improves, the size of hearing devices continues to decrease to achieve the smallest form factor possible. However, providing relatively smaller hearing devices requires providing circuitry (e.g., integrated circuits, printed circuit boards, etc.) that is also reduced in size to fit within housings of the hearing devices. Such circuitry is subject to mechanical stresses during manufacture and operation of the hearing device. However, as chip packaging associated with the circuitry becomes relatively smaller, electrical connections (e.g., wiring, solder bumps etc.) within the circuitry are more prone to mechanical stress-induced failure due to there being less chip packaging to absorb the mechanical stresses. As a result, the mechanical stresses may disrupt electrical connections within the circuitry thereby causing the hearing device to operate improperly and/or reducing the operational life of the hearing device.

BRIEF DESCRIPTION OF THE DRAWINGS

The accompanying drawings illustrate various embodiments and are a part of the specification. The illustrated embodiments are merely examples and do not limit the scope of the disclosure. Throughout the drawings, identical or similar reference numbers designate identical or similar elements.

DETAILED DESCRIPTION

Figure 1:
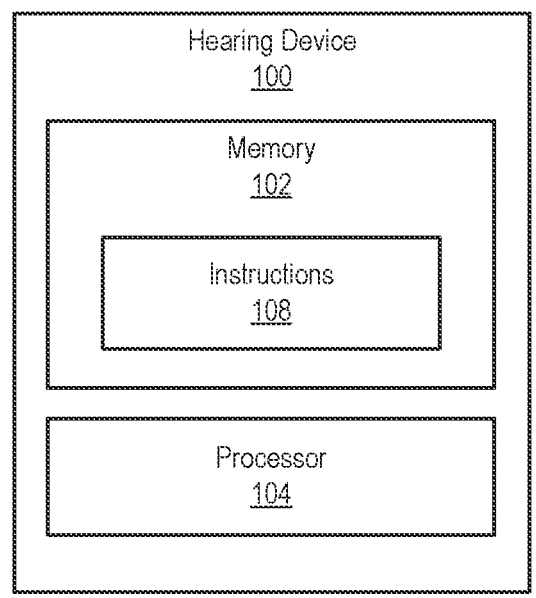
FIG. 1 illustrates an exemplary hearing device that may be implemented according to principles described herein.

Solder bump configurations in circuitry and methods of manufacture thereof are described herein. As will be described in more detail below, an exemplary hearing device may comprise a housing and a chip package disposed within the housing. The chip package may comprise a printed circuit board, an integrated circuit configured to perform an electronic function associated with the hearing device, and a plurality of solder bumps on a bottom surface of the integrated circuit. The plurality of solder bumps may provide conductive connectivity between the integrated circuit and the printed circuit board. The plurality of solder bumps may comprise a first group of solder bumps located within a center region of the bottom surface of the integrated circuit and a second group of solder bumps located within a peripheral region of the bottom surface of the integrated circuit, the peripheral region surrounding the center region. All signals required for the integrated circuit to perform the electronic function may be provided by way of the first group of solder bumps.

By providing circuitry such as described herein, it may be possible to map signals required for an integrated circuit to perform an electronic function to solder bumps that are subject to relatively less mechanical stress (e.g., due to being relatively closer to a center of a bottom surface of an integrated circuit) than other solder bumps. In so doing, circuitry such as that described herein may result in electronic devices (e.g., hearing aids) that are relatively more robust and have a relatively longer operational life than conventional electronic devices. Other benefits of the circuitry described herein will be made apparent herein.

Circuitry such as that described herein may be implemented as part of a hearing device or any other suitable electronic device that may use solder bumps to conductively connect an integrated circuit to a printed circuit board. As used herein, a "hearing device" may be implemented by any device or combination of devices configured to provide or enhance hearing to a user. For example, a hearing device may be implemented by a hearing aid configured to amplify audio content to a recipient, a sound processor included in a cochlear implant system configured to apply electrical stimulation representative of audio content to a recipient, a sound processor included in a stimulation system configured to apply electrical and acoustic stimulation to a recipient, or any other suitable hearing prosthesis. In some examples, a hearing device may be implemented by a behind-the-ear ("BTE") housing configured to be worn behind an ear of a user. In some examples, a hearing device may be implemented by an in-the-ear ("ITE") component configured to at least partially be inserted within an ear canal of a user. In some examples, a hearing device may include a combination of an ITE component, a BTE housing, and/or any other suitable component.

In certain examples, hearing devices such as those described herein may be implemented as part of a binaural hearing system. Such a binaural hearing system may include a first hearing device associated with a first ear of a user and a second hearing device associated with a second ear of a user. In such examples, the hearing devices may each be implemented by any type of hearing device configured to provide or enhance hearing to a user of a binaural hearing system. In some examples, the hearing devices in a binaural system may be of the same type. For example, the hearing devices may each be hearing aid devices. In certain alternative examples, the hearing devices may be of a different type. For example, a first hearing device may be a hearing aid and a second hearing device may be a sound processor included in a cochlear implant system.

FIG. 1 illustrates an exemplary hearing device 100 that may be implemented according to principles described herein. As shown, hearing device 100 may include, without limitation, a memory 102 and a processor 104 selectively and communicatively coupled to one another. Memory 102 and processor 104 may each include or be implemented by hardware and/or software components (e.g., processors, memories, communication interfaces, instructions stored in memory for execution by the processors, etc.). In some examples, memory 102 and processor 104 may be housed within or form part of a BTE housing. In some examples, memory 102 and processor 104 may be located separately from a BTE housing (e.g., in an ITE component), or in a module that is used on a hearing device printed circuit board ("PCB"). In some alternative examples, memory 102 and processor 104 may be distributed between multiple devices (e.g., multiple hearing devices in a binaural hearing system) and/or multiple locations as may serve a particular implementation.

Memory 102 may maintain (e.g., store) executable data used by processor 104 to perform any of the operations associated with hearing device 100. For example, memory 102 may store instructions 108 that may be executed by processor 104 to perform any of the operations associated with hearing device 100 assisting a user in hearing and/or any of the operations described herein. Instructions 108 may be implemented by any suitable application, software, code, and/or other executable data instance.

Memory 102 may also maintain any data received, generated, managed, used, and/or transmitted by processor 104. For example, memory 102 may maintain any suitable data associated with a hearing loss profile of a user, data associated with machine learning, data associated with sound processing programs, etc. Memory 102 may maintain additional or alternative data in other implementations.

Processor 104 is configured to perform any suitable processing operation that may be associated with hearing device 100. For example, when hearing device 100 is implemented by a hearing aid device, such processing operations may include (but not limited to) monitoring ambient sound and/or representing sound to a user via an in-ear receiver. Processor 104 may be implemented by any suitable combination of hardware such as circuitry described herein and software.

Figure 2:
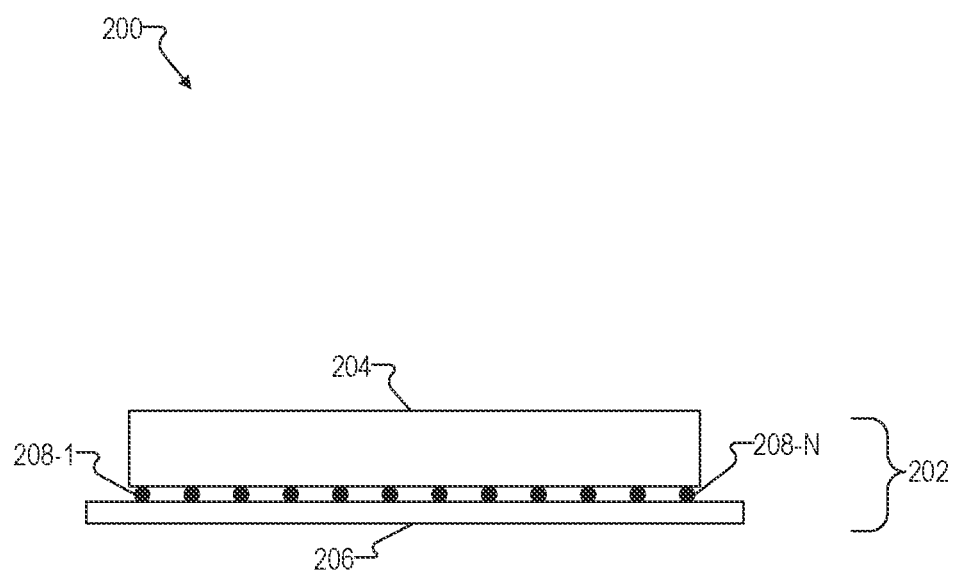
FIG. 2 illustrates an exemplary schematic side view of circuitry that may be implemented according to principles described herein.

FIG. 2 shows a schematic side view of an exemplary configuration 200 of circuitry 202 that may be implemented according to principles described herein. In certain examples, circuitry 202 may correspond to a chip package that may be implemented in an electronic device such as hearing device 100 (e.g., as part of or in conjunction with processor 104). For illustrative purposes, configuration 200 depicts a simplified representation of circuitry 202. It is understood that circuitry 202 (e.g., a chip package) may include, but is not limited to, any suitable number or type of additional layers, coverings, connections, discrete components, crystals (also referred to as "xtals"), etc. as may serve a particular implementation.

As shown in FIG. 2, circuitry 202 may include an integrated circuit 204 and a printed circuit board 206 communicatively coupled to each other by way of a plurality of solder bumps 208 (e.g., solder bumps 208-1 through 208-N). Integrated circuit 204 may include any suitable type of integrated circuit as may serve a particular implementation. For example, integrated circuit 204 may include processor 104 of hearing device 100, an advanced silicon technology node chip such as a deep neural network ("DNN") chip, and/or any other suitable type of integrated circuit.

Integrated circuit 204 may be configured to perform an electronic function associated with an electronic device. The electronic function may correspond to any suitable electronic function that may be performed by an integrated circuit. For example, in certain implementations, integrated circuit 204 may be configured to perform any suitable electronic function associated with hearing device 100. In such examples, integrated circuit 204 may include a sound processor and the electronic function associated with integrated circuit 204 may include the sound processor processing an audio signal to be represented by way of hearing device 100 to a user of hearing device 100. Additionally or alternatively, in implementations where integrated circuit 204 includes a DNN chip, the electronic function associated with hearing device 100 may include the DNN chip performing any suitable machine learning operations to process audio content.

Printed circuit board 206 may correspond to any suitable type of printed circuit board as may serve a particular implementation.

As shown in FIG. 2, plurality of solder bumps 208 connects integrated circuit 204 to printed circuit board 206. At least some of solder bumps 208 are configured to provide conductive connectivity between integrated circuit 204 and printed circuit board 206. Solder bumps 208 may be formed of any suitable material as may serve a particular implementation. For example, solder bumps 208 may be made of an alloy including tin (Sn), silver (Ag), and copper (Cu) (an "SAC" alloy) in any suitable ratio. Solder bumps 208 may have any suitable shape as may serve a particular implementation. In certain examples, solder bumps 208 may be shaped as solder balls, as shown in FIG. 2. Alternatively, solder bumps may be disc shaped, coin shaped, or have any other suitable shape.

Figure 3:
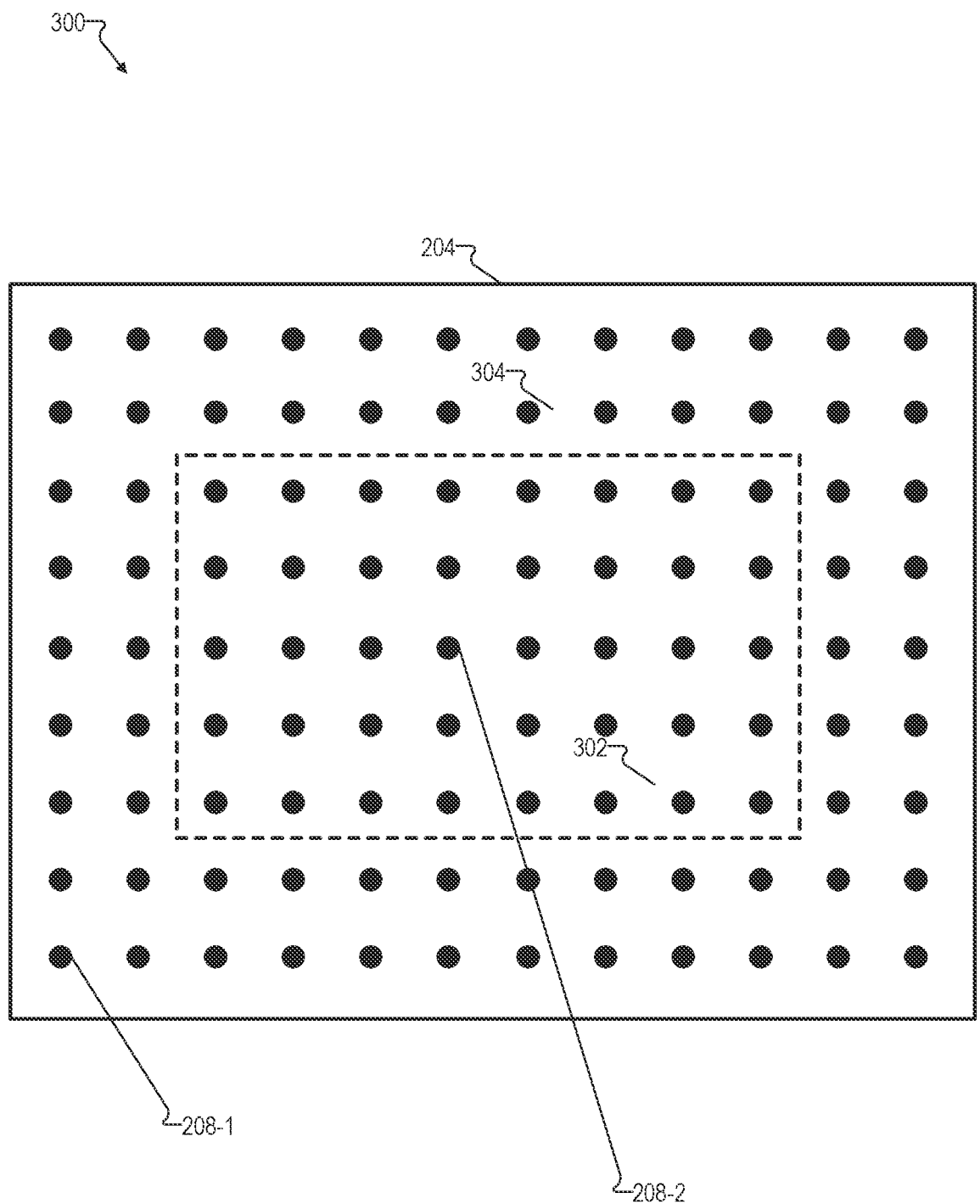
FIGS. 3-4 illustrate exemplary bump views of integrated circuits that may be implemented according to principles described herein.

Any suitable number and/or configuration of solder bumps 208 may be used as may serve a particular implementation. To illustrate, FIG. 3 shows an exemplary bump view 300 of solder bumps 208 on a bottom surface of integrated circuit 204. In the example shown in FIG. 3, solder bumps 208 are arranged in a bump grid array that has a rectangular shape with a plurality of rows and columns of solder bumps 208. However, relatively more or less solder bumps 208 and/or differently shaped bump grid arrays may be used in other implementations.

Solder bumps 208 may be formed on the bottom surface of integrated circuit 204 using any suitable manufacturing process. For example, solder bumps 208 may be formed by hand soldering, by way of a sequential flow/quench or reflow process, and/or using any other suitable methodology. In certain alternative implementations, solder bumps such as solder bumps 208 may be formed on a surface of printed circuit board 206 that is configured to face integrated circuit 204 instead of the bottom surface of integrated circuit 204.

During manufacture of integrated circuit 204 and/or the subsequent operation of integrated circuit 204, certain ones of solder bumps 208 are subject to more mechanical stresses than others. For example, the farther a solder bump is from the center of integrated circuit 204 shown in FIG. 3, the larger the mechanical stress that solder bump will sustain. To illustrate, solder bump 208-1 and other of solder bumps 208 that are positioned around a periphery of integrated circuit 204 may be subject to more mechanical stress than solder bump 208-2, which is located toward a center of integrated circuit 204. Such mechanical stresses may cause cracks or other failures in solder bump 208-1 that may cause solder bump 208-1 to fail. In view of this, solder bumps 208 that are located toward a center of integrated circuit 204 may be used for conductively connecting integrated circuit 204 to printed circuit board instead of solder bumps 208 located around a periphery of integrated circuit 204. To that end, plurality of solder bumps 208 may include a first group of solder bumps located within a center region 302 of the bottom surface of integrated circuit 204 and a second group of solder bumps 208 located within a peripheral region 304 of the bottom surface of integrated circuit 204. In the example shown in FIG. 3, center region 302 is indicated by a dashed line such that all of solder bumps 208 shown inside the dashed line are located within center region 302.

Peripheral region 304 surrounds center region 302 and may be considered as any portion of the bottom surface of integrated circuit 204 that is outside of center region 302 (e.g., outside of the dashed line box in FIG. 3). In the example shown in FIG. 3, center region 302 is shown as having forty solder bumps 208. However, center region 302 may have any suitable number of solder bumps as may serve a particular implementation.

Solder bumps 208 may be arranged within peripheral region 304 in any suitable manner. In certain examples, solder bumps 208 included within peripheral region 304 may completely surround solder bumps 208 included within center region 302, as shown in FIG. 3. In certain alternative implementations, solder bumps 208 included within peripheral region 304 may substantially or partially surround solder bumps 208 included within center region 302.

In the example shown in FIG. 3, peripheral region 304 includes two columns of solder bumps on each lateral side of center region 302 and two rows of solder bumps 208 above and below center region 302. However, any suitable number or rows/columns of solder bumps 208 may be provided within peripheral region 304 as may serve a particular implementation. For example, peripheral region 304 may include a single column of solder bumps 208 on each lateral side of center region 302 and a single row of solder bumps 208 above and below center region 302. Alternatively, peripheral region 304 may include more than two columns of solder bumps 208 on each lateral side of center region 302 and more than two rows of solder bumps 208 above and below center region 302.

In certain alternative implementations, peripheral region 304 may include a different number of columns of solder bumps 208 on each lateral side of center region 302 than rows of solder bumps above/below center region 302. For example, in certain implementations, peripheral region 304 may include two columns of solder bumps on each lateral side of center region 302, three rows of solder bumps 208 above center region 302, and three rows of solder bumps below center region 302.

Because solder bumps 208 in peripheral region 304 are subject to relatively more mechanical stresses than more peripherally located solder bumps 208, all signals required for integrated circuit 204 to perform an electronic function (e.g., an electronic function associated with hearing device 100) are provided by way of the first group of solder bumps 208 that are located within center region 302. The signals required for integrated circuit 204 to perform the electronic function may be mapped to any suitable solder bumps 208 within center region 302 as may serve a particular implementation. For example, a first solder bump within center region 302 may be mapped to a first signal required for integrated circuit 204 to perform the electronic function, a second solder bump within center region 302 may be mapped to a second signal required for integrated circuit 204 to perform the electronic function, and a third solder bump within center region 302 may be mapped to a third signal required for integrated circuit 204 to perform the electronic function. It is understood that, with such a configuration, integrated circuit 204 may be configured to operate as intended solely based on the conductive connectivity of solder bumps 208 within center region 302 regardless of the functional status of solder bumps 208 within peripheral region 304.

In examples where integrated circuit 204 is included as part of a hearing device (e.g., hearing device 100) and the electronic function includes a sound processor processing an audio signal, all audio signal processing signals associated with the processing of the audio signal may be provided by way of the first group of solder bumps within center region 302. In certain examples, a hearing device that implements integrated circuit 204 may further include a receiver (e.g., a speaker) configured to acoustically represent the audio signal to a user of the hearing device by way of an ear canal of the user. In such examples, all of the signals required for controlling and powering the receiver may be provided by way of the first group of solder bumps.

In additional or alternative examples where integrated circuit 204 corresponds to or otherwise includes a DNN chip and the electronic function is associated with the DNN chip performing machine learning operations to process audio content, all of the processing signals associated with the machine learning operations may be provided by way of the first group of solder bumps.

In certain examples, the second group of solder bumps may include mechanical relief bumps that structurally support integrated circuit 204 with respect to printed circuit board 206 without providing conductive connectivity between integrated circuit 204 and printed circuit board 206. Such mechanical relief bumps may be in contact with both printed circuit board 206 an integrated circuit 204 but do not electrically connect to conductive layers within integrated circuit 204 and printed circuit board 206. In certain implementations, all of solder bumps 208 in the second group of solder bumps located within peripheral region 304 may correspond to mechanical relief bumps.

In certain alternative implementations, a solder bump included in the second group of solder bumps may correspond to a redundant solder bump. Such a redundant solder bump may provide a redundant conductive connection between integrated circuit 204 and printed circuit board 206. The redundant conductive connection may be redundant to a conductive connection provided between integrated circuit 204 and printed circuit board 206 by way of a solder bump included in the first group of solder bumps. For example, solder bump 208-2 located within center region 302 may provide a first conductive connection and may be mapped to a signal required for integrated circuit 204 to perform an electronic function. Solder bump 208-1 may provide a second conductive connection that is redundant to the first conductive connection. That is, the second conductive connection may be mapped to the same type of signal as the signal mapped to the first conductive connection.

The redundant conductive connection may correspond to any suitable conductive connection as may serve a particular implementation. To illustrate, the first conductive connection provided by way of solder bump 208-2 may be mapped to a primary voltage source used to provide operating power to integrated circuit 204. The redundant conductive connection may be mapped to solder bump 208-1 to provide a redundant voltage source or any other signal for integrated circuit 204. As such, even if solder bump 208-1 fails (e.g., due to mechanical stress-induced cracking), integrated circuit 204 may still receive operating power by way of solder bump 208-2 and the primary voltage source.

Additionally or alternatively, the redundant solder bump may provide a redundant path to ground or any other signal for integrated circuit 204. For example, in certain implementations, solder bump 208-2 may provide a primary path to ground for integrated circuit 204. The redundant connective connection may be mapped to solder bump 208-1. As such, even if solder bump 208-1 fails, integrated circuit 204 may still have a path to ground by way of solder bump 208-2.

Figure 4:
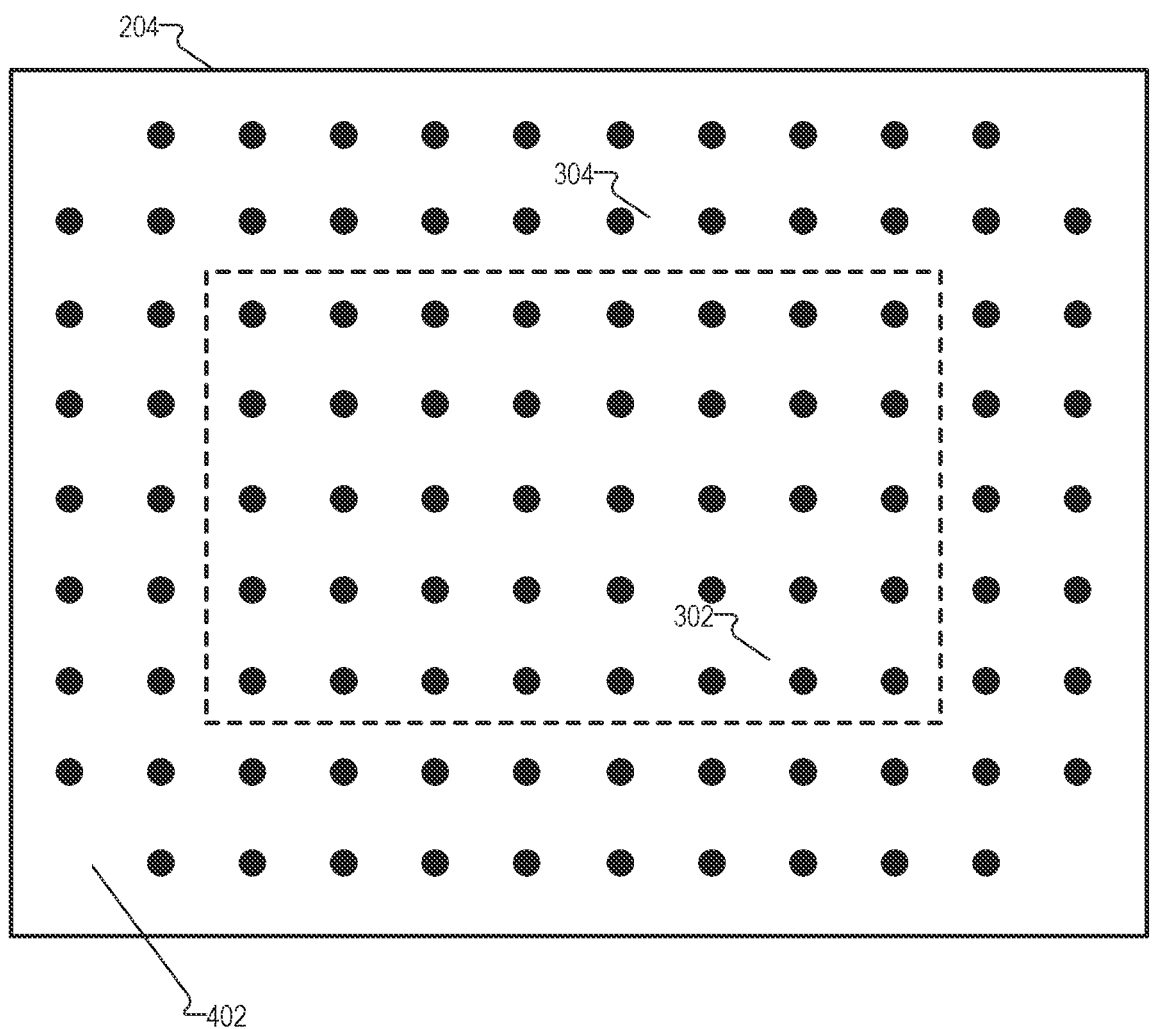

In certain examples, a bump grid array of solder bumps 208 may include a sacrificial portion at a corner of the bump grid array. The sacrificial portion may correspond to a portion of the bump grid array where a solder bump is omitted. This is because solder bumps at the corners of a bump grid array may be at the highest risk of mechanical stress-induced failure. FIG. 4 shows an exemplary configuration 400 of solder bumps 208 that may be implemented in certain examples. As shown in FIG. 4, a bottom surface of integrated circuit 204 may include a bump grid array of solder bumps 208 where solder bumps are omitted at the corners. A sacrificial portion 402 is shown in FIG. 4 as a location where a solder bump is omitted in the bottom left corner of the bump grid array. Similarly, solder bumps are also omitted in the top left corner, the top right corner, and the bottom right corner of the bump grid array.

Figure 5:
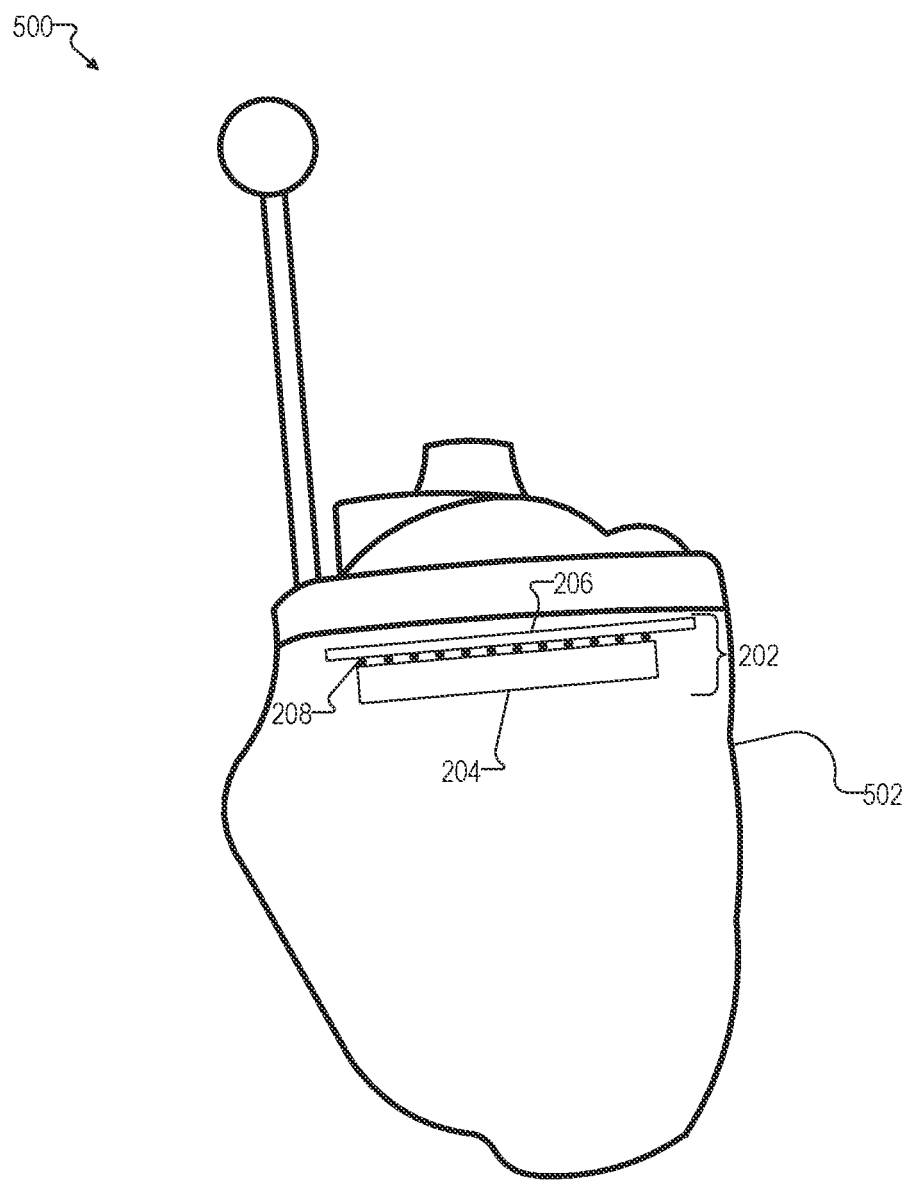
FIG. 5 illustrates an exemplary configuration of a hearing device that may be implemented according to principles described herein.

FIG. 5 illustrates an exemplary configuration 500 of a hearing device that includes circuitry configured according to principles described herein. In the example shown in FIG. 5, hearing device 500 corresponds to an in-the-canal ("ITC") type of hearing device that is configured to be inserted at least partially within an ear canal of a user. As shown in FIG. 5, circuitry 202 including integrated circuit 204, printed circuit board 206, and solder bumps 208 is provided within a housing 502 of hearing device 500. For illustrative purposes, housing 502 is shown as being see through so that circuitry 202 is visible. However, it is understood that in certain implementations housing 502 may be opaque such that it is not possible to externally view circuitry 202.

In certain alternative examples, circuitry such as that described herein may include an additional plurality of solder bumps configured to communicatively connect a printed circuit board to an additional printed circuit board. For example, printed circuit board 206 shown in FIG. 2 may include an additional plurality of solder bumps (not shown) on a bottom surface of printed circuit board 206 (e.g., a surface opposite to the surface of printed circuit board 206 that is in contact with solder bumps 208). Such an additional plurality of solder bumps may be configured to communicatively connect printed circuit board 206 to another printed circuit board within an electronic device such as hearing device 100. In such examples, the combination of integrated circuit 204 and printed circuit board 206 may correspond to a chip package that may be communicatively connected to the additional printed circuit board by way of the additional plurality of solder bumps. Such an additional plurality of solder bumps may be configured in any suitable manner such as described herein. For example, the additional plurality of solder bumps may comprise a first group of solder bumps located within a center region of the bottom surface of printed circuit board 206 and a second group of solder bumps located within a peripheral region of the bottom surface of printed circuit board 206, the peripheral region surrounding the center region. In such examples, all signals required for the integrated circuit to perform an electronic function and communicate between printed circuit board 206 and the additional printed circuit board may be provided by way of the first group of solder bumps located within the center region of the bottom surface of the printed circuit board.

Figure 6:
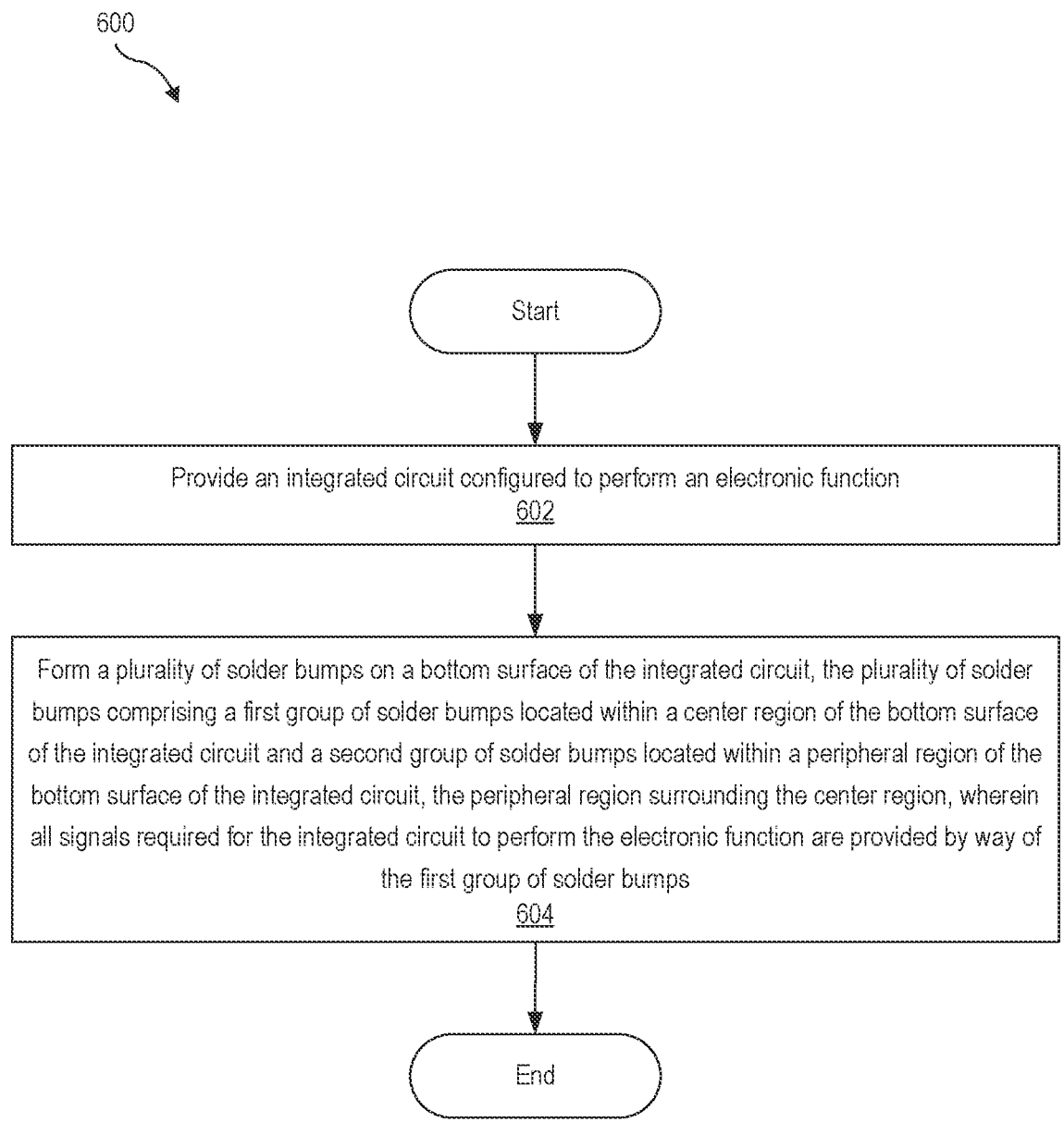
FIG. 6 illustrates an exemplary method according to principles described herein.

FIG. 6 illustrates an exemplary method 600 for configuring solder bumps in circuitry according to principles described herein. While FIG. 6 illustrates exemplary operations according to one embodiment, other embodiments may omit, add to, reorder, and/or modify any of the operations shown in FIG. 6.

At operation 602, a manufacturer of circuitry (e.g., a chip package) may provide an integrated circuit that is configured to perform an electronic function. Operation 602 may be performed in any of the ways described herein.

At operation 604, the manufacturer may form a plurality of solder bumps on a bottom surface of the integrated circuit. The plurality of solder bumps may comprise a first group of solder bumps located within a center region of the bottom surface of the integrated circuit and a second group of solder bumps located within a peripheral region of the bottom surface of the integrated circuit. The peripheral region may surround the center region. All signals required for the integrated circuit to perform the electronic function may be provided by way of the first group of solder bumps. Operation 604 may be performed in any of the ways described herein.

In certain examples, the method may further include attaching, in any suitable manner, the integrated circuit to the printed circuit board such that the first group of solder bumps conductively connect the integrated circuit to the printed circuit board.

In the preceding description, various exemplary embodiments have been described with reference to the accompanying drawings. It will, however, be evident that various modifications and changes may be made thereto, and additional embodiments may be implemented, without departing from the scope of the invention as set forth in the claims that follow. For example, certain features of one embodiment described herein may be combined with or substituted for features of another embodiment described herein. The description and drawings are accordingly to be regarded in an illustrative rather than a restrictive sense.

What is claimed is:

1. A hearing device comprising:
   a housing; and
   a chip package disposed within the housing, the chip package comprising:
      a printed circuit board;
      an integrated circuit configured to perform an electronic function associated with the hearing device; and
      a plurality of solder bumps on a bottom surface of the integrated circuit, the plurality of solder bumps providing conductive connectivity between the integrated circuit and the printed circuit board, the plurality of solder bumps comprising a first group of solder bumps located within a center region of the bottom surface of the integrated circuit and a second group of solder bumps located within a peripheral region of the bottom surface of the integrated circuit, the peripheral region surrounding the center region,
   wherein
      all signals required for the integrated circuit to perform the electronic function are provided by way of the first group of solder bumps,
      solder bumps included in the plurality of solder bumps are arranged on the bottom surface of the integrated circuit in a bump grid array, and
      the bump grid array includes a sacrificial portion at each corner of the bottom surface where a solder bump is omitted.

2. The hearing device of claim 1, wherein the second group of solder bumps includes mechanical relief bumps that structurally support the integrated circuit with respect to the printed circuit board without providing conductive connectivity between the integrated circuit and the printed circuit board.

3. The hearing device of claim 2, wherein the second group of solder bumps further includes a redundant solder bump that provides a redundant conductive connection between the integrated circuit and the printed circuit board, the redundant conductive connection being redundant to a conductive connection provided between the integrated circuit and the printed circuit board by way of a solder bump included in the first group of solder bumps.

4. The hearing device of claim 3, wherein the redundant solder bump provides a redundant voltage source or any other signal for the integrated circuit.

5. The hearing device of claim 3, wherein the redundant solder bump provides a redundant path to ground or any other signal for the integrated circuit.

6. The hearing device of claim 1, wherein the second group of solder bumps completely surrounds the first group of solder bumps.

7. The hearing device of claim 1, wherein the second group of solder bumps are arranged in a plurality of rows and columns.

8. The hearing device of claim 1, wherein the plurality of solder bumps includes a plurality of solder balls.

9. The hearing device of claim 1, wherein:
the integrated circuit includes a sound processor;
the electronic function associated with the hearing device includes the sound processor processing an audio signal to be represented by way of the hearing device to a user of the hearing device; and
all audio signal processing signals associated with the processing of the audio signal are provided by way of the first group of solder bumps.

10. The hearing device of claim 9, wherein:
the hearing device further includes a receiver configured to acoustically represent the audio signal to the user by way of an ear canal of the user; and
signals required for controlling and powering the receiver are provided by way of the first group of solder bumps.

11. The hearing device of claim 1, wherein:
the integrated circuit includes a deep neural network (DNN) chip;
the electronic function associated with the hearing device includes the DNN chip performing machine learning operations to process audio content; and
all processing signals associated with the machine learning operations are provided by way of the first group of solder bumps.

12. A method comprising:
providing an integrated circuit configured to perform an electronic function associated with a hearing device; and
forming a plurality of solder bumps on a bottom surface of the integrated circuit, the plurality of solder bumps configured to provide conductive connectivity between the integrated circuit and a printed circuit board, the plurality of solder bumps comprising a first group of solder bumps located within a center region of the bottom surface of the integrated circuit and a second group of solder bumps located within a peripheral region of the bottom surface of the integrated circuit, the peripheral region surrounding the center region, wherein
all signals required for the integrated circuit to perform the electronic function are provided by way of the first group of solder bumps,
solder bumps included in the plurality of solder bumps are arranged on the bottom surface of the integrated circuit in a bump grid array, and
the bump grid array includes a sacrificial portion at each corner of the bottom surface where a solder bump is omitted.

13. The method of claim 12, further comprising attaching the integrated circuit to the printed circuit board such that the first group of solder bumps conductively connect the integrated circuit to the printed circuit board.

14. The method of claim 13, wherein the second group of solder bumps includes mechanical relief bumps that structurally support the integrated circuit with respect to the printed circuit board without providing conductive connectivity between the integrated circuit and the printed circuit board.

15. The method of claim 13, wherein the second group of solder bumps further includes a redundant solder bump that provides a redundant conductive connection between the integrated circuit and the printed circuit board, the redundant conductive connection being redundant to a conductive connection provided between the integrated circuit and the printed circuit board by way of a solder bump included in the first group of solder bumps.

16. A hearing device comprising:
a housing; and
a chip package disposed within the housing, the chip package comprising:
a printed circuit board;
an integrated circuit configured to perform an electronic function associated with the hearing device; and
a plurality of solder bumps on a bottom surface of the integrated circuit, the plurality of solder bumps providing conductive connectivity between the integrated circuit and the printed circuit board, the plurality of solder bumps comprising a first group of solder bumps located within a center region of the bottom surface of the integrated circuit and a second group of solder bumps located within a peripheral region of the bottom surface of the integrated circuit, the peripheral region surrounding the center region, wherein
all signals required for the integrated circuit to perform the electronic function are provided by way of the first group of solder bumps, and
the second group of solder bumps further includes a redundant solder bump that provides a redundant conductive connection between the integrated circuit and the printed circuit board, the redundant conductive connection being redundant to a conductive connection provided between the integrated circuit and the printed circuit board by way of a solder bump included in the first group of solder bumps.

* * * * *